(12) United States Patent
Lite

(10) Patent No.: US 7,474,114 B2
(45) Date of Patent: Jan. 6, 2009

(54) SYSTEM AND METHOD FOR CHARACTERIZING SILICON WAFERS

(75) Inventor: Kevin Lite, Portland, OR (US)

(73) Assignee: Sitronic Corporation, Portland, OR (US)

( * ) Notice: Subject to any disclaimer, the term of this patent is extended or adjusted under 35 U.S.C. 154(b) by 316 days.

(21) Appl. No.: 11/517,765

(22) Filed: Sep. 8, 2006

(65) Prior Publication Data

US 2007/0069760 A1    Mar. 29, 2007

Related U.S. Application Data

(60) Provisional application No. 60/715,698, filed on Sep. 8, 2005.

(51) Int. Cl.
*G01R 31/26* (2006.01)
*G01R 31/28* (2006.01)

(52) U.S. Cl. .................... 324/765; 324/158.1

(58) Field of Classification Search ........... 324/765, 324/754, 761–762, 72.5, 763, 760, 158.1; 438/14–18; 257/48; 702/117, 182, 183
See application file for complete search history.

(56) References Cited

U.S. PATENT DOCUMENTS

| | | | |
|---|---|---|---|
| 5,150,042 A * | 9/1992 | Look et al. ................. 324/765 |
| 5,891,242 A | 4/1999 | Pesklak et al. |
| 6,353,317 B1 * | 3/2002 | Green et al. ............... 324/252 |
| 6,444,027 B1 | 9/2002 | Yang et al. |
| 6,476,630 B1 * | 11/2002 | Whitten et al. ............ 324/765 |
| 6,776,842 B2 | 8/2004 | Dutartre et al. |

* cited by examiner

*Primary Examiner*—Ha Tran T Nguyen
*Assistant Examiner*—Tung X Nguyen
(74) *Attorney, Agent, or Firm*—Kolisch Hartwell, P.C.

(57) ABSTRACT

A method and system is provided for characterizing silicon wafers. The method and system provide for measuring a resistance between a pair of points on an epitaxial layer of a wafer's surface. The points may be substantially equidistant from the center of the wafer. The resistance measuring may be repeated at a series of pairs of points, each pair of points being radially spaced apart from an adjacent pair of points. The series of pairs of points may include a control group of pairs. A figure of merit may be calculated by subtracting from 1.0 the ratio of a minimum resistance of the resistances measured between the pairs of points to an average of the resistances measured between the pairs of points in the control.

31 Claims, 2 Drawing Sheets

- MEASURING RESISTANCE BETWEEN A PAIR OF POINTS
- REPEATING THE STEP OF RESISTANCE MEASURING
- CALCULATING A FIGURE OF MERIT FOR AUTODOPING

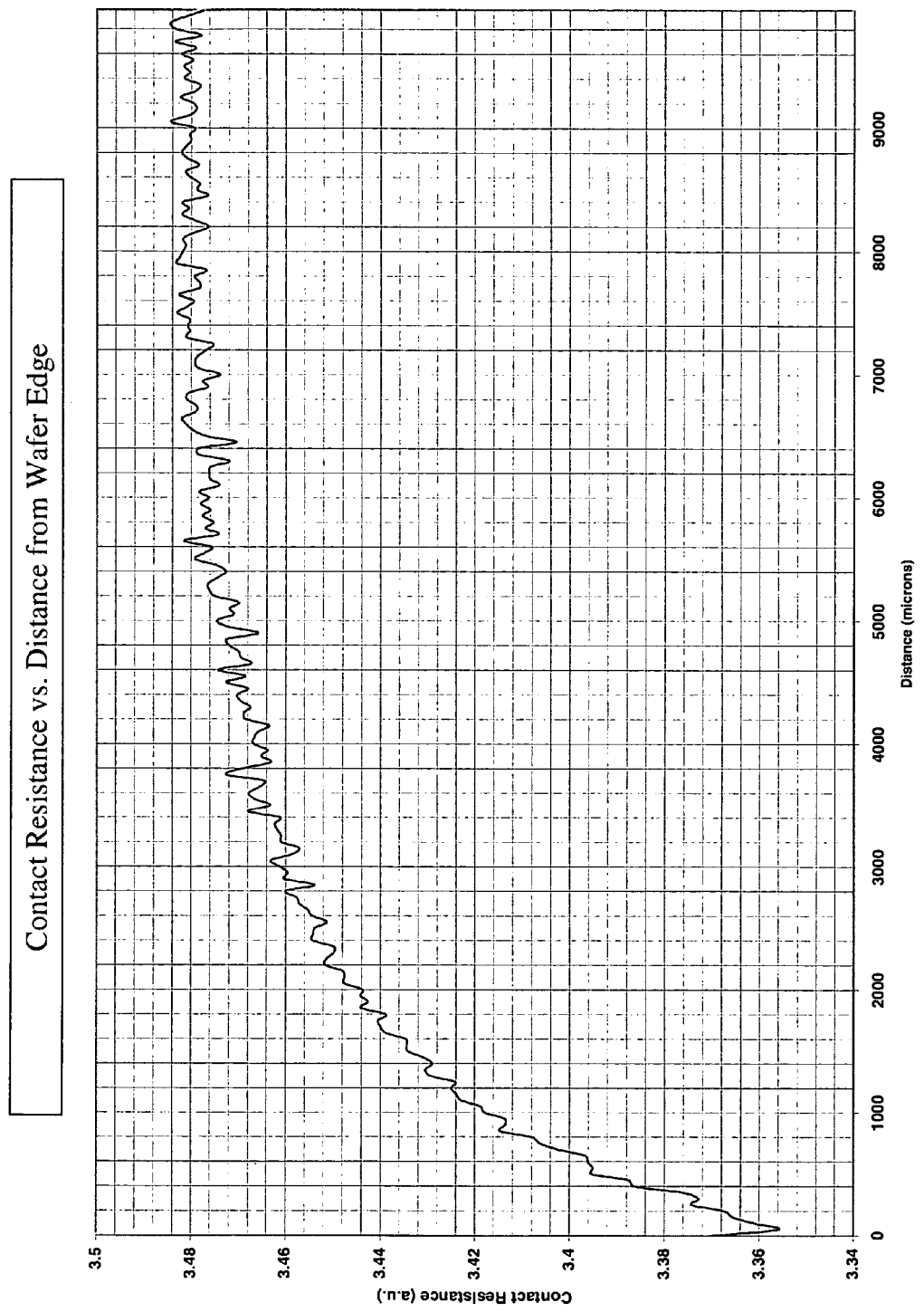

SYSTEM AND METHOD FOR CHARACTERIZING SILICON WAFERS

CROSS-REFERENCE TO RELATED APPLICATION

This application claims priority under 35 U.S.C. 119(e) to U.S. Provisional Patent Application No. 60/715,698 entitled "Method for Characterizing Autodoping in Silicon Wafers," filed Sep. 8, 2005.

TECHNICAL FIELD

The present invention relates to a system and method for characterizing a silicon wafer by measuring characteristics of the surface of the wafer. The system and method provide for measuring resistance on the surface of the wafer to characterize the autodoping of the wafer.

BACKGROUND

Silicon epitaxy devices are built on the top silicon layer of a semiconductor wafer. The yield for such devices generally is lower in portions of the wafer where the electrical resistivity of the top silicon layer is less than certain limits, particularly if the resistivity drops off abruptly. For example, the electrical resistivity typically has been seen to drop off in the region near the wafer edge. One reason that the yield may be reduced is that the lower resistivity results in a lower breakdown voltage, which reduces the yield for all types of devices and particularly for power devices.

The electrical resistivity generally reduces towards the edge of the wafer because of, among other phenomenon, autodoping. Autodoping is the reintroduction of dopant atoms into the semiconductor surface, which causes variations in dopant concentration and may reduce electrical resistivity at the surface. Autodoping can be controlled by adjusting various process parameters.

Yield per wafer improves as more of the total surface area of the wafer can reliably be used to build devices. Therefore, it is desirable to build devices throughout the wafer surface, including as close as possible to the wafer edge.

SUMMARY

Devices may be reliably built on the wafer surface in the area close to the wafer edge if the resistivity and autodoping are relatively uniform and within certain limits. The decision as to how close to build to the wafer edge can be reliably made if the characteristics of the resistivity and autodoping are known. Thus, characterizing autodoping, by monitoring the region near the wafer edge to determine if electrical resistivity in that region remains acceptable, is believed to be helpful in using more of the wafer surface for improved yield.

One embodiment provides a system and method for characterizing autodoping in one or more silicon wafers. Each wafer generally defines a center, a circular outer edge, and a front surface, and each wafer generally includes an epitaxial layer extending over the front surface. The epitaxial layer typically extends at least to within about 200 microns of the edge of the wafer. The system provides equipment for measuring a resistance between a pair of points on the epitaxial layer, the points typically being substantially equidistant from the center of the wafer. The step of resistance measuring may be repeated for a series of pairs of points, each pair of points being substantially radially spaced apart from an adjacent pair of points. The series of pairs of points may include a control group of pairs.

The system provides for calculating a figure of merit, wherein the figure of merit may be determined by subtracting from 1.0 the ratio of a minimum resistance of the resistances measured between the pairs of points to an average of the resistances measured between the pairs of points in the control. The figure of merit may be considered to characterize the autodoping of the wafer—lower figures of merit are typically associated with less autodoping.

BRIEF DESCRIPTION OF THE DRAWINGS

FIG. 4 is a plot showing the results of contact resistance measurements performed on a silicon wafer according to the method of FIG. 1.

DETAIL DESCRIPTION

Figure 1:
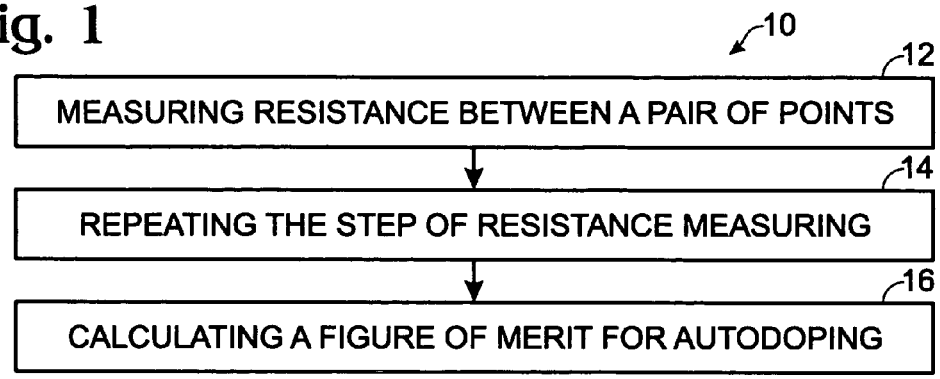
FIG. 1 is a flow diagram of a method of characterizing autodoping in a silicon wafer.

FIG. 1 shows, generally at 10, a method of characterizing autodoping in one or more silicon wafers. Method 10 may be performed on any suitable run of wafers and/or at any suitable stage in a wafer manufacturing process, including a production run of wafers and/or a sample selected from that production run. The method may be used in characterizing autodoping in the epitaxial layer of one or more silicon wafers, and may be used in any other analysis that involves the measurement of contact resistances via surface techniques. Alternatively, autodoping may be characterized from the measurement of other wafer properties. Various semiconductor processing parameters related to autodoping may be adjusted to affect the level of autodoping.

Method 10 may include measuring resistance between a pair of points on the front surface, typically on an epitaxial layer on the front surface, of a silicon wafer at 12. That step of resistance measuring may then be repeated between a series of pairs of points at 14. After the step of resistance measure is repeated, a figure of merit for autodoping may be calculated at 16. Each of those steps is described in more detail below.

Figure 2:
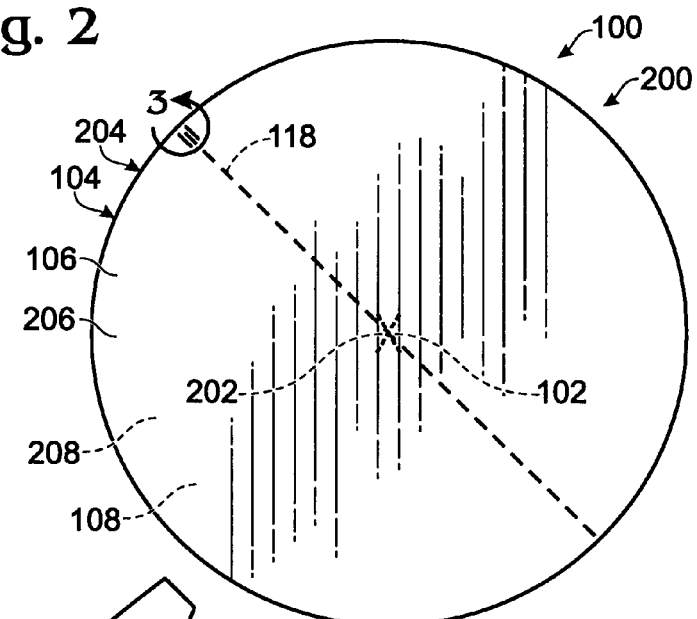
FIG. 2 is a schematic top view of a silicon wafer.

FIG. 2 shows, generally at 100, a silicon wafer. The wafer may include a center 102, a circular outer edge 104, and a front surface 106. Additionally, wafer 100 may include an epitaxial layer 108 that may extend over the front surface to within any suitable distance of the edge of the wafer. For example, the epitaxial layer may extend at least to within about two hundred (200) microns of the edge of the wafer. Moreover, wafer 100 may be any suitable size, such as one hundred fifty (150) mm or two hundred (200) mm wafers, or larger or smaller.

Figure 3:
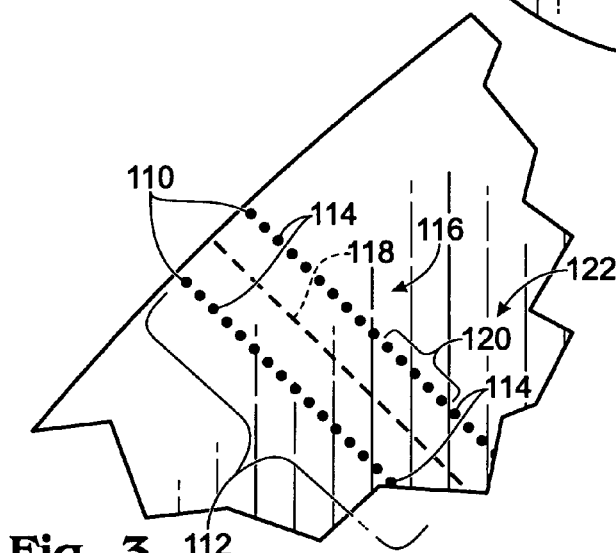
FIG. 3 is a schematic partial view of the silicon wafer of FIG. 2 showing the pairs of points where contact resistances are measured according to the method of FIG. 1.

Resistance may be measured between any suitable pair of points on epitaxial layer 108 of the wafer. For example, as shown in FIG. 3, resistance may be measured between a pair of points 110, which may be at least substantially equidistant from the center of the wafer. Although pair of points 110 is shown to be adjacent to the edge of the wafer, that pair of points may be in any suitable location. Additionally, although pair of points 110 is shown to be the last pair of points before the edge of the wafer, there may be any suitable number of additional pairs of points between pair of points 110 and the edge of the wafer.

Resistance measured between pair of points 110 is referred to as "Contact Resistance" and may take into account several factors, such as the resistance of each probe used, including the resistance at the interface between each probe and the wafer surface (Rp), the equivalent series resistance between the probes (Rs), and the spreading resistance adjacent each probe (Rsp), and/or other suitable factors. For example, resistance may be measured according to the following formula:

Contact Resistance=$2Rp+Rs+2Rsp$

The spreading resistance is believed to be the dominant component of the contact resistance and is directly related to the electrical resistivity of the wafer at each pair of points.

The step of resistance measuring may then be repeated between any suitable additional pairs of points. For example, that step may be performed on a series 112, which may include pair of points 110 and pairs of points 114. The series may be in a testing region 116 of the wafer. The testing region may be in any suitable location on the wafer configured to assist in characterizing autodoping towards the edge of the wafer. For example, the testing region may be between the edge of the wafer and about ten (10) millimeters from the edge of the wafer. Other testing regions, either narrower or wider may be used. The pairs of points may include any suitable number of pairs. For example, the series of point pairs may include about 200 pairs, or smaller or larger numbers of pairs may be used instead.

Moreover, each pair of points may be spaced apart from an adjacent pair of points at any suitable distance and/or in any suitable way. For example, the series of point pairs may be spaced apart at substantially constant intervals of no more than about fifty (50) microns between each pair. Alternatively smaller or larger spacing, and variable intervals may be used. Additionally, each of the pairs of points may be substantially radially spaced apart from an adjacent pair of points with a bisection 118 of the pairs of points intersecting center 102 of wafer 100, as shown in FIGS. 2-3.

The series may include a control group 120, which includes at least some of the pairs of points 110 and 114 at any suitable location of the wafer. For example, the control group may include the pairs of points within a control region 122 of the wafer between about nine (9) millimeters and about ten (10) millimeters from the edge of the wafer. Alternatively, or additionally, the control group may include the pairs of points that have resistance measurements within a target range. That target range may be based on process requirements, customer specifications, silicon epitaxy device requirements, or other sources. For example, customers may specify target epitaxial resistivity out to six (6) millimeters from the edge of the wafer. The values of the target range vary greatly depending on the wafer substrate, the dopants, and other factors, but an example that is typical for both p-type and n-type dopants in the substrate and the epitaxial layer, is epitaxial resistivity between about 0.7 Ohm-cm to about 5 Ohm-cm for substrates with resistivities in the range of 1 mOhm-cm to 10 mOhm-cm.

Performing the resistance measurements on the series of point pairs may lead to a plot graph, such as the graph shown in FIG. 4, which illustrates contact resistance as a function of distance from the wafer edge. Contact resistance is directly proportional to resistivity for a constant distance between the two points in each pair so FIG. 4 may also be understood to illustrate resistivity as a function of distance from the wafer edge. A statistically derived polynomial equation, or other curve equation, may be used to determine a line that best fits the individual resistance measurements.

Although testing region 116 is shown to be in a particular area of wafer 100, the testing region may be in any suitable area. Additionally, although control region 120 is shown to be in a particular area of testing region 116, the control region may be in any suitable area within or adjacent to the testing region.

A figure of merit for autodoping may then be calculated from the resistance measurements discussed above. The figure of merit or autodoping factor (AD Factor) may the determined by subtracting from 1.0 the ratio of a minimum resistance of the resistances measured between the pairs of points to an average of the resistances measured between the pairs of points in the control group.

AD Factor=1−(min[all points]/average[control group])

where "min[all points]" is the minimum of the resistances measured between all of the pairs of points (some points may be not used under certain circumstances indicating an anomalous measure at the points); and where "average[control group]" is the average of the resistances measured between the pairs of points in the control group.

Alternatively, the minimum resistance of the resistances measured between the pair of points may be calculated in any suitable way. For example, the minimum resistance may be calculated as an average of a subset of the resistances between point pairs. The subset may be any suitable selected number of lowest resistance measurements, such as between about two (2) and about one hundred (100) measurements.

The AD factor is believed to indicate the amount of autodoping in the semiconductor manufacturing process. For example, a high AD factor may indicate that there is a high amount of autodoping. The AD factor also may provide for statistical process control of autodoping, which may allow for tracking of various semiconductor manufacturing processes and/or process variables in those processes, such as the level of autodoping during the lifetime of the epitaxial reactor quartz set-up, the degradation in backside sealing and/or low temperature oxide (LTO) edge etch, the changes in critical gas flows, the changes in operating temperature, and other process parameters.

Method 10 also may include any suitable number of additional steps. For example, the method may include, prior to the step of resistance measuring 12, preparing the wafer in a region where resistance measuring will be performed. The preparation step may include polishing the wafer and/or any other suitable preparation steps.

Additionally, or alternatively, method 10 may include a step of filtering out one or more anomalous resistance measurements. The anomalous resistance measurements may be identified in any suitable way. For example, those measurements may be identified based, at least in part, on the difference between the measurements and adjacent resistance measurements. Typically, a series of resistance measurements may be analyzed using statistical techniques, such as by finding the best fit line, e.g. a polynomial equation that fits the series of resistance measurements. The anomalous resistance measurements may be identified as those that diverge from the best fit line by more than a selected number of standard deviations, typically between about 1 and 6 standard deviations.

Moreover, method 10 may include calculating a filtered figure of merit. That filtered figure of merit may be calculated in any suitable way. For example, the filtered figure of merit may be calculated from at least two figures of merit. The filtered figure of merit may be an average, a minimum, a maximum, or any other suitable number based, at least in part, on at least two figures of merit. Those figures of merit also may be calculated in any suitable way. For example, the steps of resistance measuring between the series of pairs of points (12 and 14) and the step of calculating the figure of merit (16) may be repeated at least twice for a single wafer to calculate at least two figures of merit.

Furthermore, method 10 may include calculating an average figure of merit for a plurality of silicon wafers. The average figure of merit may be calculated in any suitable way. For example, the steps of resistance measuring between the series of point pairs, and the step of calculating the figure of merit for each wafer may be repeated. The average figure of merit may then be calculated by dividing the sum of all the figures of merit by the number of wafers, or by any other suitable calculation.

Reducing the resistance measurements to a single figure of merit for one or more wafers may be helpful in statistical process control of autodoping. Tracking the figure of merit over one or more production runs of wafers may allow identification and correction of issues in process parameters and production setup and performance.

Method 10 may additionally include comparing the figure of merit (whether it is the figure of merit from step 16, the filtered figure of merit, or the average figure of merit) to a control range or a control limit. If the figure of merit is outside the control range (such as being greater than the control limit), then method 10 also may include performing one or more additional tests. The additional tests may be on the sample, the production run of wafers, both the sample and the production run of wafers, or on any suitable group or groups of wafers.

The additional tests may include any suitable tests configured to determine why the calculated figure of merit is outside a control range. For example, the additional tests may include checking the measured resistances for a discontinuity along the series of point pairs. Alternatively, or additionally, the additional tests may include repeating the steps of resistance measuring between the series of pairs of points and the step of calculating the figure of merit. The repeated steps may be performed for the sample of one or more wafers or for any suitable group or groups of wafers.

Moreover, the additional tests may include identifying an additional sample wafer 200, as shown in FIG. 2, from the production run of wafers or any suitable group of wafers. The additional sample wafer may include a center 202, a circular outer edge 204, a front surface 206, and an epitaxial layer 208 extending over the front surface to within no more than about 200 microns of the edge of the wafer. Steps 12, 14, and 16 discussed above are then performed on the additional sample wafer.

Figure 5:
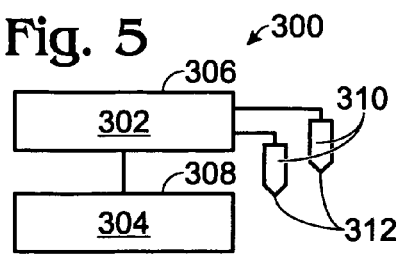
FIG. 5 is a schematic diagram of a system for gauging autodoping according to the method of FIG. 1.

Any suitable system may be used to carry out at least a part of method 10. The system may be configured to gauge autodoping for any suitable group or run of silicon wafers, such as a production run of silicon wafers. For example, as shown in FIG. 5, a system 300 may be provided.

System 300 may include any suitable structure configured to carry out or assist in one or more steps of method 10. For example, system 300 may include a measurement device 302 and a data management device 304. The measurement device may include any suitable structure configured to measure resistance between pair of points 110 and/or 114 on epitaxial layer 108 of wafer 100, and/or to measure a series of resistances between the pairs of points of series 112. For example, measurement device 302 may include an ohmmeter 306.

The ohmmeter may include leads 310 with contacts 312. The contacts are used to contact the epitaxial layer at each pair of points as discussed above. Typically the ohmmeter or associated structure provides for relative movement of the contacts with respect to the wafer. Although measurement device 302 is shown to include ohmmeter 306, the measurement device may include any suitable structure or device configured to measure resistance between pair of points 110 and/or 114 on the epitaxial layer of the wafer, and/or to measure a series of resistances between the pairs of points of series 112.

Data management device 304 may be coupled to measurement device 302 and may include any suitable device configured calculate any and/or all of figures of merit discussed above. For example, data management device 304 may include a computer 308 that is programmed to calculate one or more figures of merit for autodoping. Although data management device 304 is shown to include computer 308, the data management device may include any suitable device configured to calculate any suitable figure of merit.

Although system 300 is shown to include measurement device 302 and data management device 304, the system may include any suitable structures and devices configured to carry out or assist in one or more steps of method 10.

Additionally, although the method for characterizing autodoping in silicon wafers and features of that method have been shown and described with reference to the foregoing operational principles and preferred embodiments, those skilled in the art will find apparent that various changes in form and detail may be made without departing from the spirit and scope of the claims. The present disclosure is intended to embrace all such alternatives, modifications, and variances that fall within the scope of the appended claims.

I claim:

1. A system for use in producing silicon wafers, wherein each wafer defines a center, a circular outer edge, a front surface, and an epitaxial layer on the front surface, the system including a capability for characterizing one or more of the wafers, the system comprising:

an ohmmeter including two leads, each lead including a contact, the ohmmeter configured for measuring a resistance between a pair of points on the epitaxial layer, the points being substantially equidistant from the center of the wafer, the ohmmeter further being configured for measuring a series of resistances between a series of pairs of points, each pair of points being substantially radially spaced apart from an adjacent pair of points, the series of pairs of points including a control group of pairs;

a computer, coupled to the ohmmeter to receive the series of resistances measured by the ohmmeter, the computer programmed to calculate a figure of merit, wherein the figure of merit is determined by subtracting from 1.0 the ratio of a minimum resistance of the resistances measured between the pairs of points to an average of the resistances measured between the pairs of points in the control group.

2. The method system of claim 1 wherein the computer is programmed to use at least about 200 resistances in calculating the figure of merit.

3. The system of claim 1, wherein the ohmmeter spaces apart the point pairs by no more than about 50 microns between each pair.

4. The system of claim 1, wherein the ohmmeter measures the control group of pairs in a region of the wafer between about 9 mm and about 10 mm from the edge of the wafer.

5. The system of claim 1, wherein the ohmmeter measures the series of point pairs in a region of the wafer between the edge of the wafer and about 10 mm from the edge of the wafer.

6. The system of claim 1, wherein the computer is programmed to calculate the minimum resistance between the pairs of points as an average of a subset of the resistances between point pairs, the subset being a selected number of lowest resistance measurements.

7. The system of claim 6, wherein the computer is programmed such that the selected number of lowest resistance measurements is between about 2 and about 100 measurements.

8. The system of claim 1, wherein the computer is programmed to filter out one or more resistance measurements whose difference from adjacent resistance measurements indicates anomalous measurements.

9. The system of claim 1, wherein the ohmmeter is configured to repeat, for at least two times for a single wafer, the resistance measuring between the series of pairs of points and wherein the computer is programmed to calculate at least two figures of merit, and wherein the computer is programmed to determine a filtered figure of merit from the calculated figures of merit.

10. The system of claim 1 for use with a plurality of silicon wafers, wherein the ohmmeter is configured to repeat, for the plurality of silicon wafers, the resistance measuring between the series of point pairs; and wherein the computer is programmed to calculate the figure of merit for each wafer, and to calculate an average figure of merit for the plurality of wafers.

11. The system of claim 1, wherein the computer is programmed to compare the figure of merit to a control limit.

12. The system of claim 11, wherein the computer is programmed to check the measured resistances for a discontinuity along the series of point pairs.

13. A method for characterizing one or more silicon wafers, each wafer defining a center, a circular outer edge, and a front surface, each wafer including an epitaxial layer extending over the front surface from the center towards the outer edge, the method comprising:
  measuring a resistance between a pair of points on the epitaxial layer, the points being substantially equidistant from the center of the wafer;
  repeating the step of resistance measuring between a series of pairs of points, each pair of points being substantially radially spaced apart from an adjacent pair of points, the series of pairs of points including a control group of pairs;
  calculating a figure of merit characteristic of the one or more wafers, wherein the figure of merit is determined by subtracting from 1.0 the ratio of a minimum resistance of the resistances measured between the pairs of points to an average of the resistances measured between the pairs of points in the control group.

14. The method of claim 13, wherein the control group includes pairs of points with resistances within a target range.

15. The method of claim 13, wherein the series of point pairs includes at least about 200 pairs.

16. The method of claim 13, wherein the series of point pairs are spaced apart by no more than about 50 microns between each pair.

17. The method of claim 13, wherein the control group of pairs is in a region of the wafer between about 9 mm and about 10 mm from the edge of the wafer.

18. The method of claim 13, wherein the series of point pairs is in a region of the wafer between the edge of the wafer and about 10 mm from the edge of the wafer.

19. The method of claim 13 including, prior to the step of resistance measuring, a step of polishing the wafer in a region where the resistance measuring will be performed.

20. The method of claim 13, wherein the minimum resistance between the pairs of points is calculated as an average of a subset of the resistances between point pairs, the subset being a selected number of lowest resistance measurements.

21. The method of claim 20, wherein the selected number of lowest resistance measurements is between about 2 and about 100 measurements.

22. The method of claim 13, further including a step of filtering out one or more resistance measurements whose difference from adjacent resistance measurements indicates anomalous measurements.

23. The method of claim 13, further including repeating, for at least two times for a single wafer, the steps of resistance measuring between the series of pairs of points and the step of calculating the figure of merit, to calculate at least two figures of merit; and further including a step of determining a filtered figure of merit from the calculated figures of merit.

24. The method of claim 13, further including repeating, for a plurality of silicon wafers, the steps of resistance measuring between the series of point pairs; and the step of calculating the figure of merit for each wafer; and further including a step of calculating an average figure of merit for the plurality of wafers.

25. The method of claim 1, wherein the one or more wafers are a sample selected from a production run of silicon wafers.

26. The method of claim 25, further including a step of comparing the figure of merit to a control limit, and, if the figure of merit is greater than the control limit, performing one or more additional tests on one or both of the sample and the production run of wafers.

27. The method of claim 26, wherein the one or more additional tests includes checking the measured resistances for a discontinuity along the series of point pairs.

28. The method of claim 26, wherein the one or more additional tests includes repeating, for the sample of one or more wafers, the steps of resistance measuring between the series of pairs of points and the step of calculating the figure of merit.

29. The method of claim 26, wherein the one or more additional tests includes, identifying an additional sample wafer from the production run of wafers, the additional sample wafer defining a center, a circular outer edge, and a front surface, and including an epitaxial layer extending over the front surface from the center toward the outer edge, the layer extending at least to within about 200 microns of the edge of the wafer, and performing the following steps on the additional sample wafer:
  measuring a resistance between a pair of points on the epitaxial layer, the points being substantially equidistant from the center of the wafer;
  repeating the step of resistance measuring between a series of pairs of points, each pair of points being substantially radially spaced apart from an adjacent pair of points, the series of pairs of points including a control group of pairs;
  calculating a figure of merit for the additional sample wafer, wherein the figure of merit is determined by subtracting from 1.0 the ratio of a minimum resistance of the resistances measured between the pairs of points to the average resistance between the pairs of points in the control group.

30. The method of claim 13 for use with a production run of wafers from which the one or more wafers are taken, the wafers in the production run subject to autodoping during processing, the method further including a step of adjusting a process parameter related to autodoping.

31. A system for characterizing a production run of silicon wafers, wherein a selected wafer from the production run defines a center, a circular outer edge, and a front surface, the selected wafer including an epitaxial layer extending over the front surface from the center toward the outer edge, the layer extending at least to within about 200 microns of the edge of the wafer, the system comprising:

an ohmmeter including two leads, each lead including a contact, the ohmmeter configured for measuring a resistance between a pair of points on the epitaxial layer, the points being substantially equidistant from the center of the wafer, the ohmmeter further being configured for measuring a series of resistances between a series of pairs of points, each pair of points being substantially radially spaced apart from an adjacent pair of points, the series of pairs of points including a control group of pairs;

a computer, coupled to the ohmmeter to receive the series of resistances measured by the ohmmeter, the computer programmed to calculate a figure of merit, wherein the figure of merit is determined by subtracting from 1.0 the ratio of a minimum resistance of the resistances measured between the pairs of points to an average of the resistances measured between the pairs of points in the control group.

* * * * *